United States Patent [19]

Staiger

[11] 4,389,614
[45] Jun. 21, 1983

[54] METHOD AND APPARATUS FOR GENERATING PULSES OF A PREDETERMINED TIME RELATION WITHIN PREDETERMINED PULSE INTERVALS WITH A HIGH TIME RESOLUTION

[75] Inventor: Dieter E. Staiger, Weil im Schoenbuch, Fed. Rep. of Germany

[73] Assignee: International Business Machines Corporation, Armonk, N.Y.

[21] Appl. No.: 264,251

[22] Filed: May 18, 1981

[30] Foreign Application Priority Data

Jun. 25, 1980 [DE] Fed. Rep. of Germany ....... 3023699

[51] Int. Cl.³ .......................... H03K 3/70; H03K 3/78; H03K 3/86; H03K 5/06
[52] U.S. Cl. ....................................... 328/61; 371/27; 328/58
[58] Field of Search ...................... 371/27; 328/58, 61, 328/37

[56] References Cited

U.S. PATENT DOCUMENTS

| | | | |
|---|---|---|---|
| 3,297,952 | 1/1967 | Thylander | 328/61 |
| 3,629,710 | 12/1971 | Durland | 328/58 |
| 3,648,180 | 3/1972 | Woodcock | 328/37 |
| 3,697,879 | 10/1972 | Holliday | 328/61 |
| 3,913,021 | 10/1975 | McCarthy et al. | 328/62 |
| 4,203,543 | 5/1980 | Staiger | 371/24 |
| 4,263,669 | 4/1981 | Staiger | 371/27 |
| 4,287,594 | 9/1981 | Shirasaka | 371/27 |
| 4,330,751 | 5/1982 | Swain | 328/61 |

Primary Examiner—John S. Heyman
Attorney, Agent, or Firm—Wesley DeBruin

[57] ABSTRACT

In a method for the generation, without dead time, of pulses appearing in successive pulse intervals, with a high time resolution of the pulse intervals and of the pulses, the signals characterizing start (IIN1A, IIN2A) and end (IIN1E, IIN2E) of a pulse interval are generated under storage control by an oscillator (1) for giving coarse time raster values, and a delay circuit (3, 4) series-arranged with the oscillator (1) and with selective (7, 8) delay circuit taps (5, 6) for giving fine time raster values. The signals characterizing the pulse intervals are alternatingly applied to one of two paths (path I, path II), such that the signal characterizing the respective pulse interval start coincides with the coarse time raster predetermined by the oscillator (1). For each path, the leading and trailing edge of a pulse to be generated within a pulse interval is derived via oscillator clock-driven counters (45, 47, 46 and 48) loadable with a count, upon a specific count being reached. Series-arranged to the counters for generating the leading and trailing edges (45, 46 and 47, 48) a respective common delay circuit (51 and 52) is provided with storage-controlled (43, 44) selectable delay line taps (62 and 79) for a fine time raster. The pulse information generated on both paths is joined on a common line (65).

17 Claims, 19 Drawing Figures

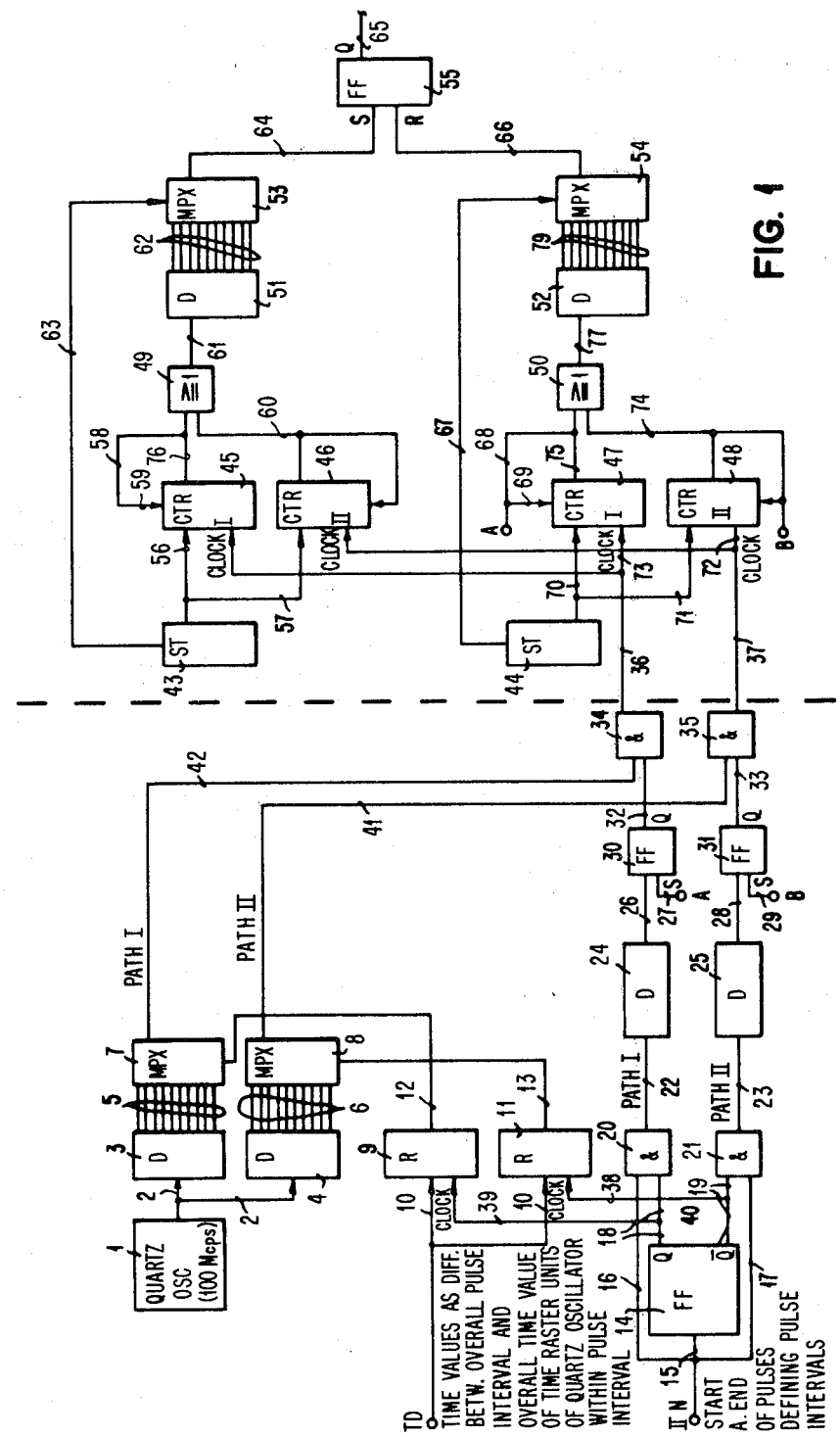

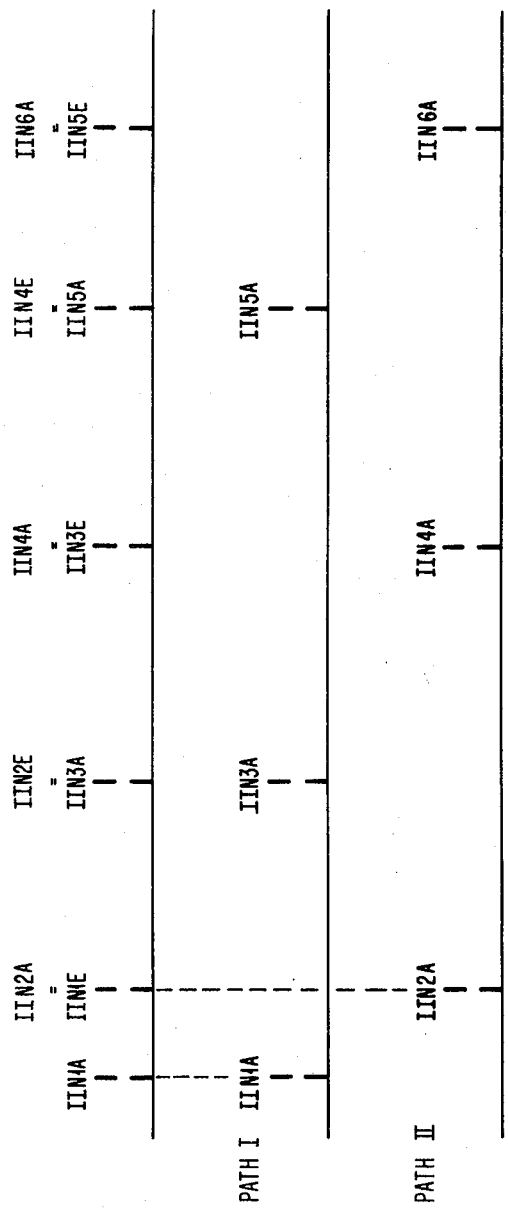

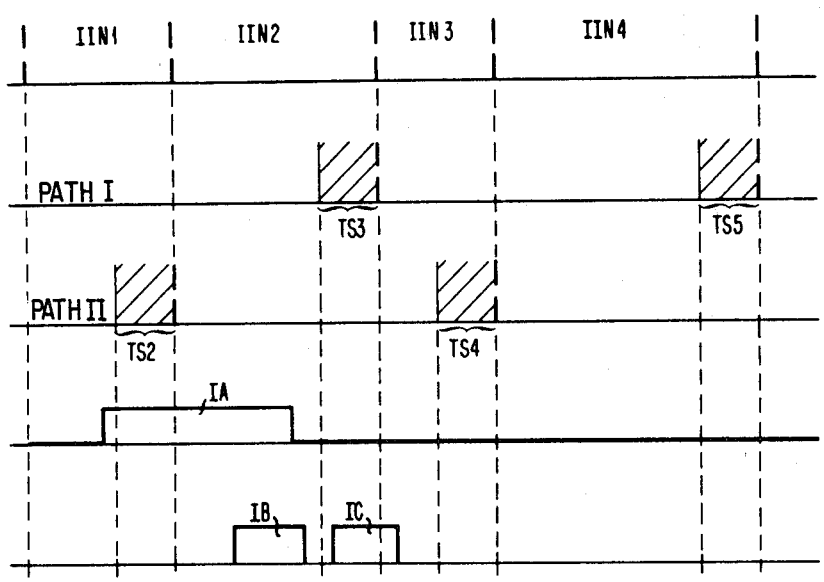
FIG. 5A
FIG. 5B
FIG. 5C
FIG. 5D
FIG. 5E
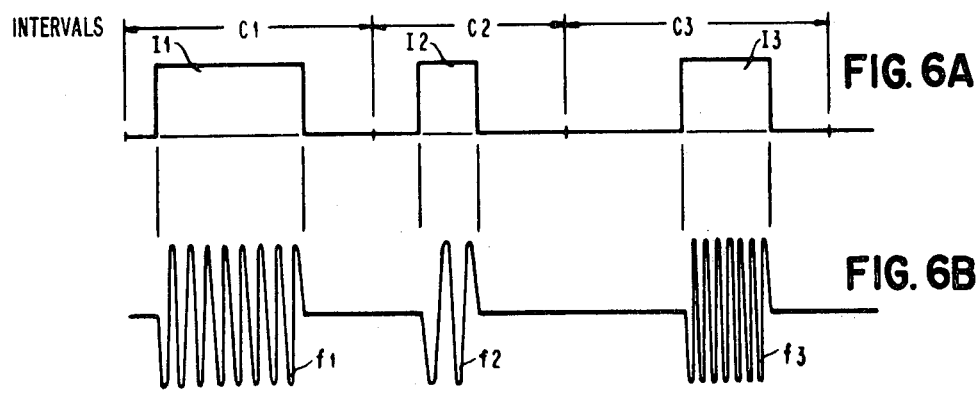
FIG. 6A
FIG. 6B
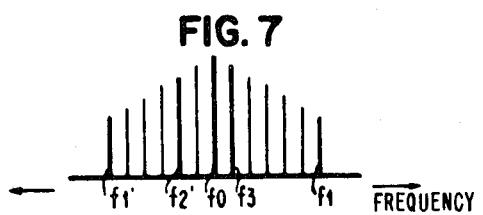
FIG. 7

METHOD AND APPARATUS FOR GENERATING PULSES OF A PREDETERMINED TIME RELATION WITHIN PREDETERMINED PULSE INTERVALS WITH A HIGH TIME RESOLUTION

The invention is directed to an improved pulse generating system.

CROSS-REFERENCE TO RELATED APPLICATIONS AND PATENTS

1. U.S. Pat. No. 4,263,669 entitled "Pattern Generation System" granted Apr. 21, 1981 to Dieter E. Staiger.
2. U.S. Pat. No. 4,203,543 entitled "Pattern Generation System" granted May 20, 1980 to Dieter Staiger.
3. U.S. Pat. No. 3,913,021 entitled "High Resolution Digitally Programmable Electronic Delay For Multi-Channel Operation" granted Oct. 14, 1975 to W. F. McCarthy et al.

BACKGROUND OF THE INVENTION AND PRIOR ART

The invention relates to a method and apparatus for generating pulse sequences gaplessly following each other.

More particularly, the practice of the invention provides pulses of precise time and accurately displaced in time.

Such pulse sequences are particularly needed for, inter alia, testing storage products (storages with associated buffers), test systems, data processing systems, and communication systems.

When storage products are tested a corresponding pulse pattern is applied thereto. The reaction of the storage product on this pulse pattern is recorded, and compared with theoretical nominal values. The comparison of both values permits a conclusion as to whether the storage product operates as required, or whether there are errors at specific locations.

The pulse sequence to be generated is initially determined theoretically by the specifications of the storage product. On the basis of these theoretical values the pulses required are generated by a pulse generator.

Formerly, a storage product was tested with a hardware testing device specifically designed for the product. However, the disadvantage of such hardware testing devices is that they can only be used for a specific storage product.

Another disadvantage is that there are so-called waiting periods during which the product to be tested can undergo specific alterations, e.g. discharge or recharge of capacities, etc.

It is to be appreciated for a better understanding of the invention that there are testing requirements where upon an occurrence determined by the product, one pulse sequence has to be followed by another one, i.e. the original pulse sequence is to be replaced by a new pulse sequence upon such an occurrence. The switching from one pulse sequence to another one required a predetermined time interval in conventional hardware testing devices. A gapless switching has not been possible with prior art devices since the switching to a new pulse sequence can only be effected subsequent in time to the fading of the electrical transients due to switching. The effect of the required waiting period, however, was that during this waiting period new conditions could appear in the product to be tested.

In U.S. Pat. No. 4,203,543 the applicant disclosed a method and apparatus for generating pulse cycles gaplessly, one following the other. The Abstract of U.S. Pat. No. 4,203,543 reads as follows:

"This discloses a pattern generator having a programmable product cycle timer in which a pulse train, i.e., the pattern generated can be repeated or switched from a first pulse frequency to a second pulse frequency without the usual transient switching periods between pulses. The invention accomplishes this by providing the generator with a cycle timer using a clock operating in conjunction with a down counter so that at a preselected time interval, before the end of the pulse is achieved, a test is made to determine if a required condition needing a different pulse frequency exists. If such a condition does not exist the present pulse frequency is reinitiated so that at count 0 it is repeated without delay. If the required condition does exist loading of the needed pulse frequency is initiated so that upon termination of the presently existing pulse at count 0, the newly selected pulse will be introduced into the product being tested without delay".

In U.S. Pat. No. 4,263,669 the applicant discloses a method and apparatus for generating pulse cycles gaplessly, one following the other. The Abstract of U.S. Pat. No. 4,263,669 reads as follows:

"This discloses a pattern generator having a programmable product cycle timer in which a pulse train, i.e., the pattern generated, having a time raster measurable to one nanosecond can be repeated or switched from a first pulse frequency to a second pulse frequency without the usual transient switching periods between pulses. The invention accomplishes this by providing the generator with a cycle timer using a ten nanosecond clock operating in conjunction with a ten nanosecond down counter so that a pre-selected time interval, before the end of the pulse is achieved, a test is made to determine if a required condition needing a different pulse frequency exists. If such a condition does not exist the present pulse frequency is reinitiated so that at count 0 it is repeated without delay. If the required condition does exist loading of the needed pulse frequency is initiated so that upon termination of the presently existing pulse at count 0, the newly selected pulse will be introduced into the product being tested without delay. A programmable cycle timer is provided to permit the implementation of pulses which has a time raster that is other than a ten nanosecond multiple".

Referring to U.S. Pat. No. 4,263,669, it is possible to provide pulse intervals in the 1 nanosecond time raster. However, the beginning of a new pulse interval has to be in accordance with the beginning of a 10 nanosecond time raster derived from a quartz oscillator. For that reason, there occurs so-called "dead times" of approximately 20 ns which appeared either before the start of a pulse to be newly generated, or after the decay of an already generated pulse, up to the beginning of the following pulse interval. This is due to the fact that the 1 nanosecond delay values for the pulses to be generated to control the circuit have to be loaded into corresponding counters, and that these loading processes can be executed only while there was no pulse generation, or after the decay of a generated pulse. It was thus not possible to provide pulse intervals following each other with a time resolution in the 1 nanosecond time raster.

Reference is made to U.S. Pat. No. 3,913,021 entitled "High Resolution Digitally Programmable Electronic Delay For Multi-Channel Operation" granted Oct. 14, 1975 to W. F. McCarthy et al. The Abstract of U.S. Pat. No. 3,913,021 reads as follows:

"A digitally programmable electronic delay may be achieved by counting pulses of a stable clock and providing an output signal when a prescribed count is reached. This is done with a synchronous counter and an Exclusive OR matching circuit. The resolution of this delay is limited by the smallest clock period that can be counted, a speed limit of the logic blocks used. Two programmable delays with different clock periods are employed such that a total delay of any combination of the two periods can be programmed. The smallest interval being the difference between the two periods. One of the clocks is a stable reference and the other is controllable. Both clock rates are divided down to a common frequency and these signals are compared in a phase detector. The output of the phase detector is fed back to the controllable clock so that the relative time position of the two clocks is held constant. The Electronic delay apparatus or timer employs a Read Only Memory (ROM) for selecting the time interval or delay. For example, in the illustrative embodiment set forth in detail hereinafter, a pulse may be delayed any integer number of nanoseconds. Correspondingly, a pulse may be provided at any integer number of nanoseconds with respect to a reference time. When the digital input word is increased, each counter produces an output at the time when the value of the counter (clock periods of delay) is equal to the respective binary data programmed into it. This will cause T delay to increase relative to T reference. T delay then, will be equal to the number of $T_1$ clock periods plus the number of $T_2$ clock periods added together. T reference will repeat every cycle at the same point in time, regardless of the programmed delay value."

SUMMARY OF THE INVENTION

It is therefore an object of the invention to avoid the dead times in the generation of pulses of predetermined time duration within predetermined successive time intervals. Namely to provide a process and an arrangement for carrying out that process by means of which it is possible to have pulse intervals of high time resolution gaplessly following each other (without dead time) and containing pulses also having a high time resolution.

BRIEF DESCRIPTION OF THE DRAWING

These and other features of the present invention will be more fully appreciated and understood by considering the following description taken in conjunction with the accompanying drawing.

The drawings show the following:

FIG. 1 is a schematic block circuit diagram, in accordance with the invention, showing the operation of the two-path circuit for generation (without dead time) of pulses of predetermined time relation with precise time resolution and within predetermined pulse intervals also of precise time resolution;

FIGS. 4A, 4B and 4C are time diagrams of assumed pulses characterizing the pulse intervals according to their beginning and end, said pulses being distributed over two paths for the circuit according to FIG. 1;

FIGS. 5A, 5B, 5C, 5D and 5E are time diagrams for the pulse generation on two paths;

FIGS. 6A and 6B are schematic representations for the keying of emission frequencies with a pulse sequence that can be generated by means of the circuit according to FIG. 1; and FIG. 7 is a schematic representation of discrete modulation frequencies arranged around a carrier frequency.

DESCRIPTION OF THE PREFERRED EMBODIMENTS

Figure 2A:
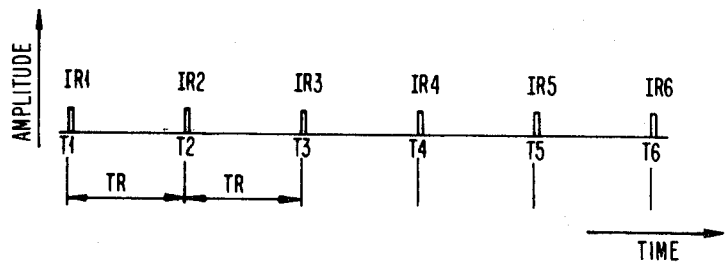
FIGS. 2A and 2B are simplified representations of a pulse raster.

The invention may be used for generating defined pulses within defined pulse intervals. The timing for the pulse intervals may be derived from a quartz-controlled pulse oscillator. The quartz control ensures a precise time resolution owing to the pulses supplied by the quartz oscillator. In FIG. 2A, these pulses are marked IR1, IR2, IR3, IR4, IR5, IR6, etc. The individual pulses are spaced from each other by a unit of time, TR; they appear at times T1, T2, T3, T4, T5 and T6. The oscillator 1 may be a 100 Mcps oscillator whose pulses are within a 10 nanosecond raster or (pulse interval). In FIG. 2A, the spacing of successive pulses, e.g. IR1, IR2, IR3, etc., is TR = 10 nanoseconds. The example of such a pulse time raster, or pulse interval, is used solely as a basis for the following discussion and explanation of the invention. It is to be appreciated that the practice of applicants' invention is not to be limited to a time raster, or pulse interval, of a particular time duration, such as TR = 10 nanoseconds. For a fuller understanding of the pulse and time ratios shown in FIG. 2A reference is made to FIG. 2B. The individual pulses are represented by simple vertical lines appearing at times T1, T2, T3, T4, T5 and T6. The time raster is characterized by filled-in circles (enlarged dots). This representation of the time raster, or pulse intervals, is also used in the following drawings.

Figure 2B:
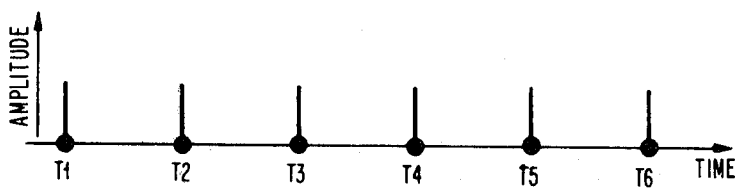
Figure 2C:
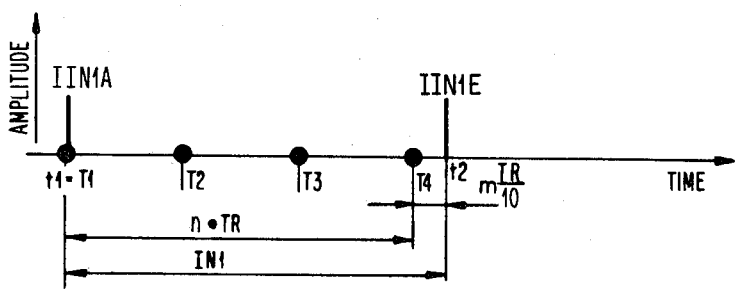
FIGS. 2C and 2D are simplified representations of a pulse interval with a pulse appearing in this interval.

FIG. 2C represents a pulse interval IN1 whose beginning and end is marked by the assumed pulses IIN1A and IIN1E. Assumed pulse IIN1A is to appear at time t1 that is equal to time T1 as represented in FIGS. 2A and 2B. Assumed pulse IIN1E appears at time t2. This time t2 does not have to be in accordance with a time raster (pulse interval) of the quartz oscillator. [As pointed out with reference to U.S. Pat. No. 4,263,669 it has been possible to generate pulse intervals in a 1 nanosecond time raster, or pulse interval, which is much finer than the 10 nanosecond time raster, or pulse interval, of the quartz oscillator. For this fine time raster, a delay line with corresponding taps for a time fine delay (in the 1 nanosecond time raster) has been used].

Figure 2D:
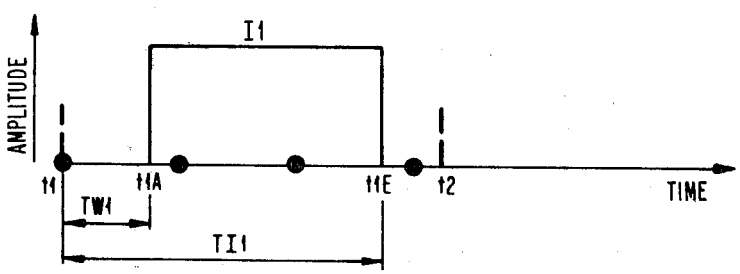

The overall time of pulse interval IN1, FIG. 2C, is composed of an integer multiple of the coarse time raster n·TR of the quartz oscillator, and an integer multiple of the fine time raster m·(TR/10) of the delay line. The pulse interval IN1 is 33 nanoseconds. This pulse interval is composed of 3×10 nanoseconds for the coarse time raster of the quartz oscillator, and 3×10/10 nanoseconds=3 nanoseconds for the fine time raster of the delay line. FIG. 2D shows that in a time interval according to FIG. 2C, between times t1 and t2, there is a pulse I1 which begins at time t1A and ends at time t1E. The values characterizing these parameters, i.e. the time of pulse start t1A after pulse interval start t1, and the duration of pulse I1 are as well as the pulse interval duration IN1, available as time values TW1 and TI1 under program control of a store. Generating pulse I1 within a predetermined time interval has been possible by means of corresponding counters and a fine delay with corresponding taps (for the individual time resolution values), as described in the above referenced U.S. Pat. No. 4,263,669. Start and end of pulse I1 may be outside the time raster, or rasters, of the quartz oscillator. Namely, neither the beginning nor the end of the pulse I1 has to coincide with an integer number of the time rasters of the quartz oscillator, nor does the duration of pulse I1 have to coincide with an integer number of the time rasters of the quartz oscillator.

Figure 3A:
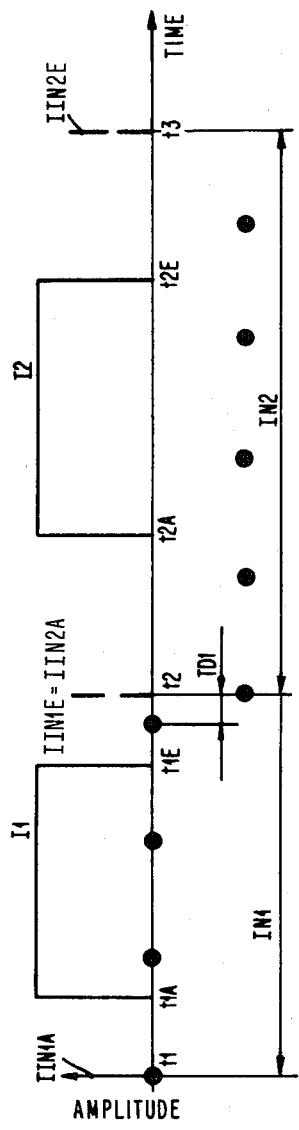
FIG. 3A is a simplified representation of two successive pulse intervals, each with one pulse.
Figure 3B:
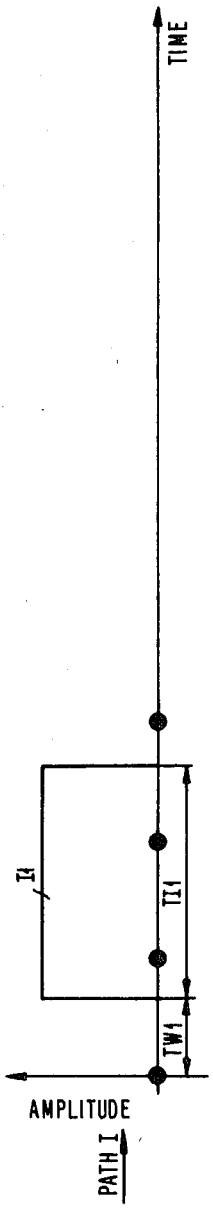
FIGS. 3B and 3C are simplified representations of the principle of pulse generation in successive pulse intervals on different paths.
Figure 3C:
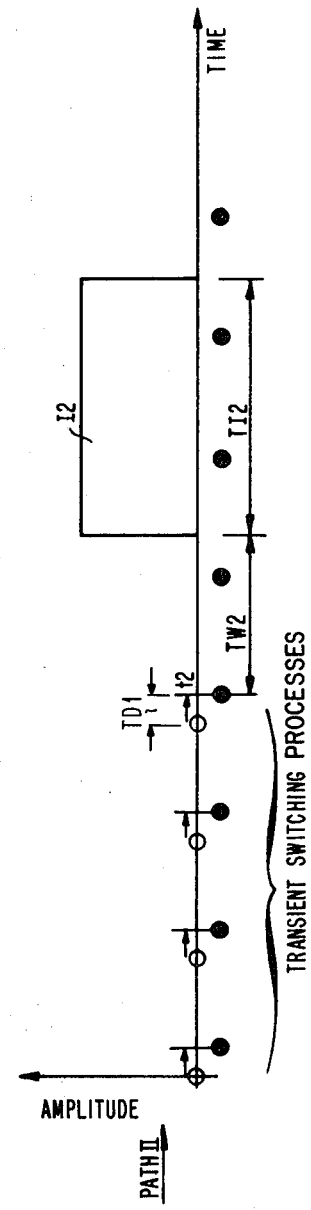

FIG. 3A shows two successive pulse intervals IN1 and IN2. Pulse interval IN1 starts at time t1, and ends at time t2; the following pulse interval IN2 begins at time t2 and ends at t3. Times t1, t2, and t3 are to be determined by assumed pulses IIN1A, IIN1E=IIN2A and IIN2E. Interval IN1 contains pulse I1 starting at t1A and ending at t1E. Pulse I2 in pulse interval IN2 begins at t2A and ends at t2E. Times t2 and t3 do not have to be in accordance with the time raster of the quartz oscillator. The time differences between the first pulse interval end t2, and the preceding time raster of the quartz oscillator is marked TD1. The generation of pulse I1 in the first pulse interval IN1, and that of pulse I2 within the second pulse interval IN2 is effected separately on two different paths. In FIG. 3B pulse I1 is generated in pulse interval IN1 on a path I. Prior to the start of interval IN1 the values characterizing this pulse, as e.g. pulse start TW1 and pulse duration TI1 are to be accessible in a store under program control. As also described in U.S. Pat. No. 4,263,669, pulse I1 can be generated by means of these values. This generation merely requires the timely activation of a corresponding delay line tap so that after the raster time of the quartz oscillator, preceding the beginning of pulse I1 at time t1A, the pulse can be derived whose end is fixed under counter control at t1E. Owing to the fact that values TW1 and TI1, characterizing the pulse I1 are available before the beginning of the pulse interval, the pulse I1 can be given at any time within the interval. The pulse I1 start may even coincide with the pulse interval start at time t1 and the pulse end may even exceed over the time of pulse interval end t2. The pulse I1 does not have to end before the end of the pulse interval, i.e. before t2, to gain time for the loading of counters that are to control the pulse generation for the subsequent pulse interval. This is true since for the generation of pulse I2 in the subsequent pulse interval IN2 another, or second path is employed. In FIG. 3C this path is marked path II. In this manner, there will be no dead times in the pulse generation within the individual pulse intervals, which otherwise would have been necessary for a timely loading of the control counters.

For generating pulse I2 in pulse interval IN2 there are theoretically two ways:

No. 1. Time t2A could be reached through a corresponding delay of time t2 characterizing the end of the first pulse time interval. It should be pointed out here that t2 should be in accordance with the raster measure, i.e. the time raster measure of the quartz oscillator. For this solution there could be a delay line with many delay line taps of a corresponding time resolution. However, the disadvantage of this solution would be that the desired top precision of the quartz-controlled timing would be abandoned, and that operations would continue only with the inaccurate delay line taps. This would have a negative effect when time TW2 exceeds a time raster measure of the quartz oscillator.

No. 2. However, for basing the time generation of pulse I2 mainly on the quartz-controlled time raster of the quartz oscillator, start t2 of the second pulse time interval IN2 is to be brought in accordance with the raster measure of the quartz oscillator. For that purpose, the time raster of the quartz oscillator, before the start of second pulse time interval IN2, is separated from path 1 by delay TD1. Such a delay may be effected by a delay line with taps in accordance with a corresponding time resolution. This delay line merely requires a maximum delay value less than the time raster of the coarse quartz oscillator (i.e. with a 10 nanosecond time raster of the quartz oscillator this delay line requires only a total of 9 taps in a 1 nanosecond succession). Switching the pulse raster of the quartz oscillator to another delay line tap results in electrical transients with will have to decay by the start t2 of the second pulse interval IN2 at the latest. These switching transients appear in path II while on path I pulse I1 is generated within an unchanged time raster of the quartz oscillator pulse. Therefore, the two paths have no negative mutual influence. Pulse I2 in the second pulse time interval IN2 is generated analogously to pulse I1.

The reference to the switching transients is further explained below. As the multiplex control circuits are continuously supplied with the 10 nanosecond raster pulses of the 100 Mcps quartz oscillator it is conventionally incorrect to refer to "switching transients", because such transients appear only in connection with the switching-on of a signal. Since the adding of a delay line tap by the multiplex control circuit with the 10 nanosecond time raster sequence is not synchronized it may happen that such adding is effected precisely during a 10 nanosecond raster pulse, and "destroys" the pulse, i.e. this "destroyed" pulse is ineffective for future switching. In this manner, only the pulse appearing after the "destroyed" pulse within the 10 nanosecond time raster sequence can be effective for the switching. The time between a "destroyed" pulse and its subsequent pulse is in the present context (unconventionally) called "transient switching process". As a result of such "transient switching" the new pulse, decisive for switching processes, will be available only after a predetermined (transient switching) time.

In this manner, the pulses for successive pulse intervals are alternatingly generated on paths I and II. In other words: Generation of pulse I1 on path I, followed by the generation of pulse I2 on path II, followed by the generation of pulse I3 on path I, followed by the generation of pulse I4 of path II, etc. The pulse generated on separated paths I and II are joined summarily to obtain the pulse sequence represented in FIG. 3A.

FIG. 1 shows an arrangement for generating pulses of predetermined time relation, one to another, with precise time resolution and within intervals with an equally precise time resolution. This arrangement is of such a design that a pulse generation without dead times is accomplished.

As shown in the basic representation of FIG. 4A, each pulse interval is characterized by an assumed pulse interval start and an assumed pulse interval end. The pulse intervals follow each other. Thus, the pulse interval end of a preceding pulse interval coincides with the pulse interval start of the following pulse interval. The pulse interval start for the first pulse interval is marked IIN1A, the pulse interval end for the first pulse interval is marked IIN1E. The second pulse interval following the first pulse interval has a pulse interval start marked IIN2A=IIN1E, and a pulse interval end marked IIN2E. The subsequent, third, fourth, and fifth pulse intervals, etc. are marked analogously. The left-hand portion of the circuit of FIG. 1 has the function of dividing the parameters characterizing the individual pulse intervals, i.e. IIN1A, IIN2A=IIN1E, . . . , etc. over two paths (I and II).

FIG. 4B shows that starts IIN1A, IIN3A, IIN5A, etc., of the odd-numbered pulse intervals are to be associated with path I, and starts IIN2A, IIN4A, IIN6A, etc., of the even numbered pulse intervals are to be associated with path II. [It is to be appreciated that a gapless generation of subsequent pulse intervals with a high time resolution (1 nanosecond time raster compared with the 10 nanosecond time raster of a 100 Mcps quartz oscillator) has been possible already in accordance with U.S. Pat. No. 4,263,669, but only with the restriction that corresponding dead times had to be excepted.]

To explain the operation of the circuit in the left-hand portion of FIG. 1, reference is once more made to FIGS. 3A, 3B and 3C. For the first pulse interval between IIN1A and IIN1E, the 10 nanosecond time raster of the 100 Mcps oscillator remains unaltered (path I); for the subsequent second pulse interval between IIN2A and IIN2E, however, a shifting of the 10 nanosecond time raster of the 100 Mcps oscillator by time value TD1 (e.g. 3 nanoseconds) is necessary (path II). Following the second pulse interval, the third pulse interval would again be processed via path I, the fourth pulse interval via path II, etc. Time values TD by which the time rasters of successive pulse intervals are to be shifted relative to each other are given via a circuit as described in U.S. Pat. No. 4,263,669. These time shift values TD are used for effecting a time shift of the corresponding 10 nanosecond time rasters for paths I and II. The 10 nanosecond time raster generated by a 100 Mcps quartz oscillator 1 is applied via lines 2 to a delay circuit 3, and also to a delay circuit 4. Each delay circuit is equipped with a series of taps, each tap being one nanosecond time increment of delay. The output lines (taps) of delay circuit 3 are marked 5, and the output lines (taps) of delay circuit 4 are marked 6. According to a control value, each of these delay circuit taps can be activated selectively. The selection of a delay circuit tap of delay circuit 3 is effected via multiplex control circuit MPX 7. A delay circuit tap of delay circuit 4 is selected via multiplex control circuit MPX 8. According to FIGS. 3B and 3C it is assumed that no shift of the 10 nanosecond time raster is to be effected for the first pulse interval (path I). The shift control value would thus be 0, and the 10 nanosecond raster sequence of quartz oscillator 1 would be transmitted without delay to line 42 (path I) via line 2, delay circuit 3, and the top line (tap) of line group 5.

According to the representation of FIG. 3C, however, the 10 nanosecond time raster sequence for path II would have to be shifted by time TD1, e.g. 3 nanoseconds, with reference to the time raster sequence for path I. For that purpose, multiplex control circuit 8 would be supplied via line 13 with the value 3, which, in turn, would select the fourth line (fourth tap down) of line group 6. On this line (delay circuit tap) the 10 nanosecond time raster sequence of the 100 Mcps quartz oscillator 1 has a time delay of 3 nanoseconds. [As stated earlier, the delay circuit taps have a time succession of 1 nanosecond each. The top line (tap) does not provide any time delay, the second line provides a time delay of 1 nanosecond, the third line provides a time delay of 2 nanoseconds, the fourth line provides a time delay of 3 nanoseconds, etc.]

By selecting the corresponding delay line tap it is thus possible to give to the 10 nanosecond raster sequence of the quartz oscillator which is applied via line 2 to the delay circuit 4, a time delay of 3 nanoseconds. This delayed 10 nanosecond time raster sequence would then be available for path II on line 41. Reference has already been made to the fact that the shift values for the 10 nanosecond time raster of the individual pulse intervals are known. These values are marked TD in FIG. 1. They represent the difference of the entire pulse interval length to the overall time of all 10 nanosecond time raster units of the quartz oscillator within the pulse interval. The shift values are available via line 10 for register 9 and subsequently for register 11. A corresponding clock control of registers 9 and 11 ensures that these values are made available in time for controlling multiplex control circuits 7 and 8 respectively. The shift value from register 9 reaches via line 12 multiplex control 7; the shift value from register 11 reaches multiplex control 8 via line 13. The clock control of register 9 is effected via line 39, and the clock control of register 11 via line 38. Owing to the clock control only one shift value from a register is applied, at one time, to the associated multiplex control circuit. For the first pulse interval. (FIG. 3B) shift value 0 corresponding to this pulse interval is applied from register 9 via line 12 to multiplex control circuit 7 (path I); subsequently, for the second pulse interval (FIG. 3C) shift value 3 corresponding to this pulse interval is applied from register 11 via line 13 to multiplex control circuit 8.

The operation of the lower left-hand portion of the circuit of FIG. 1 will now be described. The function of this circuit portion is the distribution of the 10 nanosecond time rasters of successive pulse intervals on paths I and II. For better understanding of the operation of the circuit reference is made to FIG. 4. It is assumed that the various parameters IIN, each characterizing the pulse interval start and pulse interval end, are available on line 15 (FIG. 1). In other words on line 15 there is information in accordance with FIG. 4A.

It is the function of the circuit to distribute the individual values represented in FIG. 4A on paths I and II as shown in FIG. 4B for path I, and as shown in FIG. 4C for path II. To accomplish this function, a so-called JK-flipflop 14 is employed. This flipflop has an input 15 and two outputs, i.e. the Q-output (line 18), and the output (line 19). The JK-flipflop responds to the positive leading edge of each of the IIN pulses. In response to the first IIN pulse on line 15, the Q-output (line 18) of the flip-flop generates a positive value. Line 18 is applied to an AND gate 20 whose second input 16 is connected to input 15 of flipflop 14. When a positive value appears on line 18 as well as on input 15 of flipflop 14 (with a time shift being disregarded in this instance) AND gate 20 provides an output pulse on line 22 of path I. In FIG. 4B the pulse corresponds to IN1A. After the appearance of the second IIN pulse (denoted in FIG. 4A as IIN1E=IIN2A), flipflop 14 produces at its $\bar{Q}$ output (line 19) a positive pulse. This positive pulse is applied to the first input of AND gate 21. The second input of AND circuit 21 is connected to input 15 of flipflop 14. AND circuit 21 provides a positive output on line 23 of path II which is represented in FIG. 4C as pulse IIN2A. (With each positive input pulse edge, JK flipflop 14 switches its outputs Q and $\bar{Q}$ alternatingly to a positive output value).

Analogously, there exists on line 22, path I, and on line 23, path II, the individual pulse interval conditions represented in FIGS. 4B and 4C respectively. In this manner it is possible to divide the sequence of the start and end pulses characterizing the individual pulse intervals in accordance with FIG. 4A, into one sequence for path I (FIG. 4B), and one sequence for path II (FIG. 4C). With the appearance of the output signals at the Q and $\bar{Q}$ outputs of flipflop 14 on lines 18, 39 and 19, 38 registers 9 and 11 are clocked. It is assumed for the first pulse interval that the shift value TD is equal to zero (0) and for the second pulse interval that the shift value TD is three (3). The zero value is provided to register 9 on line 10 and the three value to register 11 on line 10. The appearance of pulse IIN1A on lines 18 and 39 provides a clocking of register 9; the value TD=0 will control via line 12 multiplex control circuit 7. At the following time, during the appearance of pulse IIN2A on line 19, register 11 (TD=3) will be clocked by this pulse via line 38. The shift value in register 11 will be applied via line 13 to multiplex control circuit 8.

The information on line 22, path I, is applied via a delay circuit 24 and line 26 to a flipflop 30. The flipflop's output, line 32, is applied to an AND gate 34. The second input of AND gate 34 is connected to line 42 (path I). The function of AND gate 34 is to switch the 10 nanosecond time raster pulse on line 42 for the first pulse interval. This is accomplished as follows: When pulse IIN1A on line 22 is applied to flipflop 30 an output signal is generated at the Q-output of this flipflop on line 32. The Q output signal of flip-flop 30 is applied to AND circuit 34. This output signal on line 32 is maintained until the flipflop is reset via line 27. In other words, if there is a signal on line 32 the 10 nanosecond time raster pulse on line 42 can pass via AND gate 34 to its output line 36. (The resetting of flipflop 30 via line 27 is referred to and explained hereinafter). Since the switching of the 10 nanosecond time raster from one tap of delay line 3 or 4 to another will cause switching transients the time raster should pass AND gate 34 only after the switching transients have decayed. For that reason, AND gate 34 should be conductive only after a corresponding delay time caused by flipflop 30. Should this delay time of flipflop 30 be too short another delay circuit 24 is provided.

The above statements apply analogously to path II as far as the switching of the 10 nanosecond raster, shifted by 3 nanoseconds (TD has value of 3) for the second pulse interval on line 41, via AND gate 35 and on line 37 is concerned. AND gate 35 is preceded by a delay circuit 25 and a flipflop 31. The connecting line between delay circuit 25 and flipflop 31 is designated 28. The connecting line between flipflop 31 and AND gate 35 is designated 33. Delay circuit 25 has an input connected via line 23 to the output of AND gate 21. The functions of the individual elements for path I and path II correspond. Flipflop 31 is first controlled via pulse IIN2A (see FIG. 4C), and reset later via line 29. (The resetting of flip-flop 31, via line 29 is referred to and explained hereinafter). The signal at the output of flip-flop 31 is applied, via line 33, to AND gate 35. The second pulse interval is initiated via AND gate 35 ten nanosecond time raster pulse on line 41 (path) and a signal line 33. The application of coincident input signals to AND gate 35 provides an output signal on line 37. Flip-flop 31 is reset via line 29 at the end of the second pulse interval.

Thus, the 10 nanosecond time rasters shifted in time if necessary, are available on lines 36 and 37 during the individual pulse intervals, in such a manner that the beginning of each pulse interval coincides with a 10 nanosecond time raster mark. According to paths I and II, the 10 nanosecond time rasters are alternatively available on line 36 for the odd-numbered pulse intervals, and on line 37 for the even-numbered pulse intervals.

After having described the time shift of the 10 nanosecond time rasters for successive pulse intervals the generation of the individual pulses within the pulse intervals will now be explained. This object has partially been achieved already in U.S. Pat. No. 4,263,669. According thereto, a pulse interval start pulse (also called cycle start pulse) was used for generating, in time relation to its leading edge during a current pulse cycle, a pulse of predetermined width and predetermined timing to the leading edge of the cycle start pulse. For that purpose, the cycle start pulse was applied to a delay unit. The delay unit shows at its output a plurality of output lines. Each one of these output lines is associated to a specific delay time. The plurality of these output lines leads to a multiplex circuit. This multiplex circuit receives from a programmable store the instruction which output line of the delay unit is to be selected for a specific delay time. The delay line selected is switched from the multiplex circuit to its output, and applied to a flipflop. Upon the appearance of the delayed leading edge of the cycle start pulse, the flipflop switches so that there is a voltage step at its output. This voltage step represents the start of the pulse to be generated within a cycle. The pulse end is determined by the following steps: The output of the multiplex control circuit is connected to a second delay unit which, in turn, shows a plurality of output lines which are associated to different delay times. These lines lead to a second multiplex circuit which is connected to a programmable store. Upon the appearance of the delayed leading edge of the cycle start pulse this edge is delayed by the second delay unit to a value which is predetermined by the programmable store of the second multiplex circuit. At the output of the second multiplex circuit, the leading edge of the cycle start (delayed further than by the first multiplex circuit) is available. It is applied to the above mentioned flipflop which subsequently, at its output, neutralizes the voltage step caused by the first delayed leading edge of the cycle start pulse, and thus terminates the pulse generation during one pulse interval. Thus, by means of a respectively programmed selection of the delay times a pulse is generated of predetermined width and with predetermined timing to the leading edge of the cycle start pulse. The pulse generation within one cycle had thus always been referred to the cycle start pulse. The data in the store do not only determine the cycle start times, but also the pulses to be generated within the individual cycles. These values could vary with respect to the pulse width and the timing relative to the cycle start.

This known method [U.S. Pat. No. 4,263,669] of generating a pulse within a cycle is used here, too, on the basis of the so-called two-way process (Paths I and II).

Below, the generation of the pulse for the first cycle (pulse interval) will be described. As this explanation is based on path I the description and explanation will start from line 36 where the 10 nanosecond time raster pulse for the first pulse interval is available. This 10 nanosecond time raster pulse is applied via line 36 to a Down counter 45 and a Down counter 47. Counter 45 generates the leading edge of the pulse to be generated in the first pulse interval (first cycle), whereas counter 47 is used for generating its trailing edge. Prior to the beginning of the first pulse interval, counter 45 is loaded from a store 43, via line 56, with a time value corresponding to the time delay of the leading edge of the pulse to be formed from the start of the first pulse interval. (It is to be appreciated that DOWN counters 45 and 47 are utilized only in conjunction with odd numbered 10 nanosecond pulse intervals.) Analogously, counter 47 is loaded from store 44, via line 70, with a time value which corresponds to the time delay of the trailing edge of the pulse to be formed from the start of the first pulse interval. Thus, it is apparent that DOWN counters 45 and 47 are used during every odd-numbered pulse interval to define the duration of the pulse occurring therein. With the appearance of the first 10 nanosecond raster pulse within the first pulse interval, counters 45 and 47 start Down-counting. (Each further 10 nanosecond raster pulse for odd-numbered pulse intervals means a further clock for the Down counting of counters 45 and 47). When count 0 is reached in counter 45 a signal is provided at its output which, via line 76, is applied to a first input of an OR gate 49. The output of DOWN-counter 45 (line 76) is also used via lines 58 and 59 to reset counter 45. The resetting of Down counter 45 conditions this counter for a new loading process from store 43 for the third pulse interval. The Down counter 45 output signal (76) is applied via OR gate 49 and line 61 to a delay circuit 51. This delay circuit has a number of delay line taps 62, with all but the top one providing an additional one nanosecond of delay. Alternatively stated, each tap of delay line 62, except one, increment the delay by one nanosecond, i.e., the time resolution of the delay line taps is greater than the 10 nanosecond raster meaasure of the 100 Mcps quartz oscillator used. A delay line tap 62 is selected by multiplex control circuit 53. The control value, for the time, "fine delay", of the leading edge signal generated by counter 45, is received by the multiplex control circuit via line 63 from store 43. The store 43 also contains the number value to be placed in Down counters 45 and 46 for each of the 10 nanosecond raster steps or pulse intervals. The leading edge signal, time delayed in accordance with the selected delay line tap, is available at the output of multiplex control circuit 53 on line 64, The delayed leading edge signal is impressed on the SET input of flipflop 55. Responsive to the delayed leading edge signal on line 64 the Q-output 65 of flipflop 55 is set (Up condition), which corresponds to the beginning of the pulse to be generated within the first cycle or first pulse interval. The signal on line 65 is reset (Down condition) only when a signal is impressed via line 66 on the reset input of flipflop 55. The signal on line 66 may be termed the trailing edge signal since it represents the trailing edge of the pulse generated in the pulse interval. The trailing edge signal is generated analogously to what has been stated above for the leading edge signal but with reference to store 44, Down counter 47, etc. Namely, when Down counter 47 reaches value 0 it generates on its output line 75 a trailing edge signal which via OR gate 50 and line 77 is applied to a delay circuit 52. Delay circuit 52 has a number of delay line taps 79. One of these delay line taps is selected via multiplex control circuit 54 which receives its control value via line 67 from store 44. The corresponding fine time delayed trailing edge signal is applied to the reset input R of flipflop 55 via output line 66 of multiplex control circuit 54. Furthermore, the counter output signal on line 75 is used via lines 68 and 69 to reset Down counter 47, and to condition it for reloading with a count value from store 44 for the third pulse interval or cycle. The signal on line 75 is also employed via line 68, connection point A, and line 27 for resetting flipflop 30. In the manner explained above, the pulse is generated in the first pulse interval. For generating the pulse in the subsequent second pulse interval, Down counters 46 and 48 are used. Prior to the beginning of the second pulse interval, counter 46 is loaded with corresponding count value from store 43 via line 57. (Down counters 46 and 48 are employed to provide the leading edge signal and the trailing edge signal, respectively, for each of the pulses of the even numbered pulse intervals). A corresponding technique is used during the second pulse interval to generate the trailing edge signal. Namely, counter 48 is loaded with a corresponding count value via line 71 from store 44. With the appearance of a 10 nanosecond raster pulse for the second pulse interval on line 37, counters 46 and 48 begin down counting. When count 0 is reached in counter 46, counter 46 emits via its output line 60 and OR gate 49 a leading edge signal to delay circuit 51. This signal is subjected to a fine time delay, the fine time delay value being supplied from store 43 to multiplex control circuit 53 to effect the selection of the corresponding delay line tap. After count 0 has been reached in counter 48 determining the trailing edge signal, its output line 74 provides a signal which is applied via OR gate 50 and line 77 to delay circuit 52. Delay circuit 52 subjects the trailing edge signal to a fine time delay, the magnitude of which is determined by the delay tap 79 selected by multiplexer circuit 54 under control via line 67 of a value stored in store 44. The signal on line 74 also, via terminal B and line 29 resets flipflop 31.

It is once more pointed out that the pulses for the odd-numbered pulse intervals are generated via path I, whereas those for the even-numbered pulse intervals are generated via path II. The generation of the pulses in pulse intervals directly following each other may fully or partly overlap with respect to time.

The fact that the outputs of counters 45 and 46, which generate the pulse leading edges, are joined via OR gate 49 has the advantage that only one delay circuit 51 with the associated multiplex control circuit 53 has to be used for generating a fine time raster. In the other case (not shown), i.e. when the outputs of counters 45 und 46 are separately arranged via an associated delay circuit, the delay circuits have to operate fully identically to prevent a time deviation of the leading edge pulses. The above applies analogously to counters 47 and 48 in connection with their series-arranged delay circuit 52 and its associated multiplex control circuit 54.

In the circuit described in FIG. 1, the generated pulses are exactly reproducible. In other words, the precision of the information determined by the 10 nanosecond time raster is quartz precise; due to delay circuits 51 and 52 the fine time rasters are ruled by the precision of these delay circuits.

Consequently, the repeat precision of the generated pulses is determined by quartz oscillator 1.

For further explaining the advantages of the above described system for generating discretionary pulse patterns, reference is made to FIGS. 5A to 5E. FIG. 5A is a schematic representation of successive pulse intervals (IIN1, IIN2, IIN3, IIN4).

FIGS. 5B and 5C show how these pulse intervals can be assumed to be distributed over the various paths, I and II. The odd-numbered pulse intervals are covered by path I, the even-numbered pulse intervals by path II. The "transient switching times, or processes" mentioned in connection with FIG. 1 with reference to delay circuits 3 and 4 are marked TS2, TS3, TS4, TS5. It is to be noted that these "transient switching times" TS appear before the respective start of the pulse intervals decisive for the individual path I or II. Namely, the transient switching times occurring in path I take place in the latter portion of even numbered pulse intervals, whereas the transient switching times occurring in path II take place in the latter portion of the odd-numbered pulse intervals. The pulses on path I which are to be generated during the individual pulse intervals are not to extend into times TS; the same applies for the pulses on path II to be generated during the individual pulse intervals.

A pulse IA to be generated (see FIG. 5D) can extend over the first pulse interval IIN1 (path I) into the second pulse interval IIN2 (path II).

It is equally possible (see FIG. 5E) to generate on path I a pulse IB in such a manner that with respect to time it appears during the second pulse interval IIN2. If this pulse IB is now to be followed by another pulse IC to be generated, this pulse IC is to be generated on path II. Again, it is possible to extend the generation of such a pulse over the second pulse interval into the third pulse interval (again path I).

There can be no overlapping of the "transient switching times" TS for paths I and II because delay lines 3, 4 do not operate in an overlapping mode.

It is thus possible to compose a pulse to be generated of partial pulses generated on paths I and II (FIG. 5D). A pulse started during a pulse interval then continues in the following pulse interval.

It is also possible to effect the appearance of a pulse programmed in a pulse interval only in the successive pulse interval (see pulse IB in FIG. 5E).

A pulse programmed in a pulse interval can, of course also appear in the same pulse interval (pulse IC in FIG. 5E).

In this manner, double pulses can be generated for extremely short pulse intervals. The zones of the "transient switching times" TS that are prohibited for pulse generation do not have a negative effect on pulse generation in accordance with the two-path method. Thus, programmable continuous patterns of maximum time resolution and precision can be generated without any dead times.

Reference is made to the fact that the use of the circuit in accordance with the invention is applicable in particular to the field of testing high speed storage products or high speed logic circuits. It is of particular advantage for programming discretionary pulse patterns without knowing the hardware.

In the illustrative embodiment, reference is made to a 1 nanosecond time resolution. The circuit principle and method, as disclosed by the invention, is fully applicable to embodiments using higher speed circuitry where the time resolution is greater than one nanosecond. According thereto, a fine time raster is possible derived from a predetermined coarse raster with a specific circuit technique.

Furthermore, the circuit described can also be used for the gapless frequency switching (e.g. for switching transmission frequencies), or for the circuit-controlled generation of frequencies, also in acoustics.

FIG. 6A shows that within programmable pulse intervals C1, C2, C3, as they can be generated in accordance with the invention, pulses I1, I2, and I3 can be provided.

FIG. 6B shows that pulses I1, I2, and I3 can be used for keying identical or different transmission frequencies f1, f2, f3. If pulses I1, I2 and I3 are of a length which almost corresponds to the length of pulse cycles C1, C2, and C3 it is possible that identical or different transmission frequencies may be gaplessly switches (and without transient switching processes).

It is acknowledged that the keying of transmission frequencies through corresponding pulses is extensively taught in the prior art. The practitioners in the art are well acquainted therewith, and thus it will not be described in detail herein.

Another field of use for the invention lies in the generation of corresponding frequencies. FIG. 7 shows that e.g. in the modulation of a carrier frequency there appears an entire frequency spectrum. The frequencies within such a spectrum extend from f1' to f1, the individual modulation frequencies being around the actual carrier frequency f0.

If within this frequency spectrum individual discrete frequencies, e.g. f2' or f3 are to be generated this is also possible by means of the circuit as disclosed by the invention. It has been specified above that by giving corresponding time values in storage, the individual cycle times can be programmed. This means that after a predetermined period following the appearance of a cycle (or pulse interval) start pulse another cycle (or pulse interval) start pulse is generated for the following pulse cycle (or pulse interval). The shortest cycle time that can be reached according to existing circuit technology is in the order of approximately 30 nanoseconds. The generation of several successive short cycle start pulses is an equivalent to the giving of a frequency corresponding to this cycle time. Due to the programmability of the cycle time length it is consequently possible to generate differing frequencies. The resolution of the circuit according to the invention, as disclosed, is in the 1 nanosecond range and thus permits the generation of discrete frequencies with a mutual distance of approximately 2.3 Mcps (with an assumed maximum cycle time of approximately 655 µs), or 1 Mcps (with an assumed minimum cycle time of approximately 30 ns).

Owing to the programmable switching of carrier frequencies (transmission frequencies) a "secret" communication of data is possible when the programmable switching from one transmission frequency to the other is known to the transmitter and receiver side only.

Frequencies can also be generated in the lower frequency area (audible sound range). The principle of generating sound frequencies is the same as in the generation of high frequencies in the mega-cycle per second range. It is thus possible to generate sound frequencies, and to switch gaplessly without transient switching processes. Generally, transient switching processes are not considered to be disturbing to the human ear owing to the latter's inertia. However, a generation of sound frequencies and their switching without transient switching processes is of interest for the field of measuring technology.

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of the invention.

I claim:

1. A method for generating, without dead time, pulses appearing in successive pulse intervals, the pulse intervals and pulses being generated with precise time resolution, said method being characterized in:
    that the signals characterizing start (IIN A1, IIN2A) and end (IIN1E, IIN2E) of a pulse interval are generated under storage control by an oscillator (1) for providing coarse time raster values, and by a delay circuit (3, 4) arranged in series with the oscillator (1), with selective (7, 8) delay circuit taps (5, 6) for fine time raster values;
    that the signals characterizing the pulse intervals are alternatingly applied to a respective one of two paths (path I, path II) in such a manner that the signal characterizing the respective beginning of the pulse interval is in accordance with the time raster value given by the oscillator (1);
    that for each path the leading and trailing edge of a pulse to be generated during a pulse interval is derived via counters (45, 47, 46, and 48) driven by an oscillator clock and loadable with a count from a store (43, 44) when a specific count is reached; and
    that for generating the leading and trailing edge (45, 46 respectively 47 and 48) a common delay circuit (51 and 52, respectively) with store-controlled (43, 44), selectively addressable delay circuit taps (62, 79 respectively) is arranged in series to the counters for a fine time raster, and that the pulse information generated in accordance with both paths is joined on a common line (65).

2. Apparatus for the generation, without dead time, of pulses appearing in successive pulse intervals, the pulse intervals and pulses being generated with precise time resolution, said apparatus being characterized:
    by an oscillator circuit (1) connected to a delay circuit (3) and to a delay circuit (4);
    that each of these delay circuits (3, 4) shows a number of taps (5, 6) for different delay values (5, 6), said different delay values being selectively addressable under store control via one respective multiplex control circuit (7, 8);
    that the multiplex control circuit (7) output characterizes path I and is applied to an AND gate (34);
    that the multiplex control circuit (8) output characterizes path II and is applied to an AND gate (35);
    that the signals defining the pulse intervals are alternatively applied via a flip-flop (14) to AND gates (34 and 35);
    that the output of the AND gate (34) is connected to a counter (45) re-loadable via a store (43) for forming the leading edge of a first pulse to be generated, and to a counter (47) re-loadable via a store (44) for generating the trailing edge of said first pulse;
    that the output of the AND gate (35) is connected to a counter (46) re-loadable via the store (43) for generating the leading edge of a second pulse to be generated, and to a counter (48) re-loadable via store (44) for generating the trailing edge of said second pulse;
    that the outputs of these counters (45 and 46 and 47 and 48, respectively), provided for generating the leading and trailing edges of said first and second pulses, are each connected to a common delay circuit (51 and 52, respectively), each of said delay circuits 51, 52 having a number of taps (62, 79) for different delay values which under control of stores (43, 44) are each selectively addressable via a multiplex control circuit (53 and 54, respectively); and
    that the outputs of both multiplex control circuits (53, 54) are joined (65).

3. Apparatus, as recited in claim 2, characterized in that
    the counters (45, 46, 47, 48) are Down counters.

4. Apparatus, as recited in claim 2, characterized in that the outputs (64, 66) of the multiplex control circuits (53, 54) are joined via a flip-flop (55).

5. Apparatus, as recited in claim 2, characterized in that
    the AND gates (34 and 35) are each preceded by a delay circuit (24, 25).

6. Apparatus, as recited in claims 2 or 5, characterized in
    that the AND gates (34 and 35) are each preceded by a flip-flop (30, 31) connected to the outputs of the counters (47, 48).

7. Apparatus for the generation of pulses appearing in successive pulse intervals, each of said pulse intervals having an origin time and a duration time, the origin time and the duration time of each of said pulse intervals being independently precisely controlled, each of said pulses having a start time occurring within a pulse interval and a termination time occurring within a pulse interval, the start time and the termination time of each of said pulses being independently precisely controlled, said apparatus comprising:
    an oscillator circuit means providing an essentially invariant periodic output;
    a first delay circuit means having an input connected to the output of said oscillator circuit means and one through n outputs, each of said one through n outputs, except said first output, respectively corresponding to an increased increment of delay provided by said first delay circuit means;
    a second delay circuit means having an input connected to the output of said oscillator circuit means and one through n outputs, each of said one through n outputs, except said first output, respectively corresponding to an increased increment of delay provided by said second delay circuit means;
    a first multiplex control circuit having one through n inputs respectively connected to said one through n outputs of said first delay circuit means, a control input adapted to receive a signal for selecting one of said n outputs of said first delay circuit means and an output;

a second multiplex control circuit having one through n inputs respectively connected to said one through n outputs of said second delay circuit means, a control input adapted to receive a signal for selecting one of said n outputs of said second delay circuit means and an output;

a first source of pulses, the pulses of said first source of pulses respectively representing time values, where said time values bear a relationship between the period of said oscillator means and said origin time and said duration time of each of said successive pulse intervals;

a first register having an input connected to said first source of pulses, a control input and an output connected to said control input of said first multiplex control circuit;

a second register having an input connected to said first source of pulses, a control input and an output connected to said control input of said second multiplex control circuit;

a second source of pulses, the pulses of said second source of pulses respectively representing time values corresponding to the origin time of a first pulse interval and the duration time of the pulse interval immediately preceding said first pulse interval;

a first flip-flop circuit having an input connected to said second source of pulses, a first (true) output Q connected to said control input of said first register and a second (complement) output $\overline{Q}$ connected to said control input of said second register;

a second flip-flop circuit having a set input, a reset input and a true output Q;

a third flip-flop circuit having a set input, a reset input and a true output Q;

a first AND circuit having a first input connected to said output of said second source of pulses, a second input connected to said first (true) output Q of said first flip-flop and an output connected to said set input of said second flip-flop;

a second AND circuit having a first input connected to said second (complement) output $\overline{Q}$ of said first flip-flop, a second input connected to said second source of pulses and an output connected to said set input of said third flip-flop;

a third AND circuit having a first input connected to said output of said first multiplex control circuit, a second input connected to said true output Q of said second flip-flop, and an output;

a fourth AND circuit having a first input connected to said output of said second multiplex control circuit, a second input connected to said true output Q of said third flip-flop, and an output;

a first store for storing numerical values, said first store having a first output and a second output;

a second store for storing numerical values, said second store having a first output and a second output;

a first OR circuit having a first input, a second input and an output;

a second OR circuit having a first input, a second input and an output;

a first counter having an input connected to said second output of said first store, a control (clock) input connected to said output of said third AND circuit, a reset input, and an output connected in common to said first input of said first OR circuit and said reset input of said first counter;

a second counter having an input connected to said second output of said first store, a control (clock) input connected to said output of said fourth AND circuit a reset input, and an output connected in common to said second input of said first OR circuit and said reset input of said second counter;

a third counter having an input connected to said second output of said second store, a control (clock) input connected to said output of said third AND circuit, a reset input, and an output connected in common to said first input of said second OR circuit, said reset input of said third counter, and said reset input of said second flip-flop circuit;

a fourth counter having an input connected to said second output of said second store, a control (clock) input connected to said output of said fourth AND circuit, a reset input, and an output connected in common to said second input of said second OR circuit, said reset input of said fourth counter and said reset input of said third flip-flop circuit;

a third delay circuit means having an input connected to the output of said first OR circuit and one through n outputs, each of said one trough n outputs, except said first output, respectively corresponding to an increased increment of delay provided by said third delay circuit means;

a fourth delay circuit means having an input connected to the output of said second OR circuit and one through n outputs, each of said one through n outputs, except said first output, respectively corresponding to an increased increment of delay provided by said fourth delay circuit means;

a third multiplex control circuit having one through n inputs respectively connected to said one through n outputs of said third delay circuit means, a control input adapted to receive a signal for selecting one of said one through n outputs of said third delay circuit means, said control input of said third multiplexer control circuit being connected to the first output of said first store, and an output;

a fourth multiplexer control circuit having one through n inputs respectively connected to said one through n outputs of said fourth delay circuit means, a control input adapted to receive a signal for selecting one of said one through n outputs of said fourth delay circuit means, said control input of said fourth multiplexer control circuit being connected to the first output of said second store, and an output; and a fourth flip-flop circuit having a set input connected to said output of said third multiplexer control circuit, a reset input connected to said output of said fourth multiplexer control circuit and an output Q, said output Q of said fourth flip-flop circuit functioning as an output terminal for said apparatus for the generation of pulses appearing in successive pulse intervals.

8. Apparatus for the generation of pulses appearing in successive pulse intervals, as recited in claim 7, wherein a fifth delay circuit is serially included in the connection between said output of said first AND circuit and said set input of said second flip-flop circuit, and a sixth delay circuit is serially included in the connection between said output of said second AND circuit and said set input of said third flip-flop circuit.

9. Apparatus for the generation of pulses appearing in successive pulse intervals, as recited in claim 7, wherein said first, second, third and fourth counters are respectively Down counters whose count, at least in certain instances, progresses from a numerical value to a lesser numerical value or zero and wherein counters 45 and 46 are respectively utilized in determining the start time of said successive pulses generated by the apparatus and counters 47 and 48 are respectively utilized in determining the termination time of said successive pulses generated by the apparatus.

10. Apparatus for the generation of pulses appearing in successive pulse intervals, as recited in claim 7, wherein said oscillator circuit means includes a quartz controlled oscillator.

11. Apparatus for the generation of pulses in successive pulse intervals, as recited in claim 7, wherein said quartz controlled oscillator circuit means provides a pulse of very short duration every ten nanoseconds, and said increased increment of time delay of each of said second through nth outputs of said first, second, third, and fourth delay circuit means, respectively, is one, two, three, four, five, six, seven, eight and nine nanoseconds.

12. A pulse generator for providing first, second, third, fourth, fifth, sixth, seventh, eighth, ninth, tenth, etc., through nth successive discrete pulse intervals, where n is a sizeable even positive integer, said first through nth pulse intervals varying one from another in time duration, each of said first through nth pulse intervals having a distinct time of origin and first, second, third, fourth, fifth, sixth, seventh, eighth, ninth and tenth, etc., through nth successive discrete pulses, said first through nth pulses being each contained within a separate one of said first through nth successive discrete pulse intervals, said first through nth pulses varying one from another in time duration, each of said first through nth successive discrete pulses having a distinct start time and a distinct end time, said pulse generator comprising:
- a source of periodic pulses having a substantially invariant periodicity;
- first controllable means responsive to said source of periodic pulses for successively distinctly manifesting said time of origin of each of said first, third, fifth, seventh, ninth, etc., through n−1th pulse interval;
- second controllable means responsive to said source of periodic pulses for successively distinctly manifesting said time of origin of each of said second, fourth, sixth, eighth, tenth, etc., through nth pulse interval;
- third controllable means responsive to said first means for successively distinctly manifesting said start time and said end time of each of said first, third, fifth, seventh, ninth, etc., through n−1th pulse;
- fourth controllable means responsive to said second means for successively distinctly manifesting said start time and said end time of each of said second, fourth, sixth, eighth, tenth, etc., through nth pulse; and
- fifth means responsive to said third and fourth controllable means for providing said first through nth pulses respectively contained within said first through nth pulse intervals.

13. A pulse generator, as recited in claim 12 wherein said source of periodic pulses having a substantial invariant periodicity is a quartz controlled oscillator.

14. A pulse generator, as recited in claim 13, wherein said first controllable means and said second controllable means are respectively essentially equivalent in structure one to the other, and said third controllable means and said fourth controllable means are respectively essentially equivalent in structure one to the other.

15. A pulse generator, as recited in claim 14, wherein said second, third, fourth and fifth controllable circuit means each include delay circuit means having a plurality of taps respectively providing incremented periods of delay and multiplexer control circuit means connected to said plurality of taps of said delay circuit means.

16. A pulse generator, as recited in claim 15, wherein said third controllable means and said fourth controllable means each include counter circuit means and data storage means for setting a count in said counter circuit means.

17. A pulse generator for providing a first pulse train having first, second, third, fourth, fifth, sixth, seventh, eighth, ninth, tenth, etc., through nth successive discrete pulse intervals, where n is a sizeable even positive integer, said first through nth pulse intervals varying one from another in time duration, each of said first through nth pulse intervals having a distinct time of origin and first, second, third, fourth, fifth, sixth, seventh, eighth, ninth and tenth, etc., through nth successive discrete pulses, said first through nth pulses being each contained within a separate one of said first through nth successive discrete pulse intervals, said first through nth pulses varying one from another in time duration, each of said first through nth successive discrete pulses having a distinct start time and a distinct end time, said pulse generator comprising:
- a source of periodic pulses having a substantially invariant periodicity;
- first circuit means connected to said source of periodic pulses and providing a second pulse train having said first, third, fifth, seventh, ninth, etc., through n−1th pulses;
- second circuit means connected to said source of periodic pulses and providing a third pulse train having said second, fourth, sixth, eighth, tenth, etc., through nth pulses; and
- output circuit means connected to, and responsive to said first and second circuit means for combining said second pulse train and said third pulse train to provide said first pulse train having said first, second, third, fourth, etc., through nth pulses respectively contained within said first, second, third, fourth, etc., through nth pulse intervals.

* * * * *

UNITED STATES PATENT AND TRADEMARK OFFICE
CERTIFICATE OF CORRECTION

PATENT NO. : 4,389,614

DATED : June 21, 1983

INVENTOR(S) : Dieter E. Staiger

It is certified that error appears in the above-identified patent and that said Letters Patent is hereby corrected as shown below:

| | |
|---|---|
| Column 8, line 63 | before "output" insert --$\overline{Q}$--. |
| Column 15, line 67 | "alternatively" should read --alternatingly--. |
| Column 17, line 43 | "Q" should read --$\overline{Q}$--. |

Signed and Sealed this

Eighth Day of May 1984

[SEAL]

Attest:

GERALD J. MOSSINGHOFF

Attesting Officer

Commissioner of Patents and Trademarks